(12) United States Patent
Minegishi

(10) Patent No.: US 10,076,037 B2
(45) Date of Patent: Sep. 11, 2018

(54) PRINTED CIRCUIT BOARD, ELECTRONIC DEVICE, AND MANUFACTURING METHOD OF PRINTED CIRCUIT BOARD

(71) Applicant: CANON KABUSHIKI KAISHA, Tokyo (JP)

(72) Inventor: Kunihiko Minegishi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/687,763

(22) Filed: Aug. 28, 2017

(65) Prior Publication Data
US 2018/0092211 A1 Mar. 29, 2018

(30) Foreign Application Priority Data
Sep. 27, 2016 (JP) .................. 2016-188369

(51) Int. Cl.
| | | |
|---|---|---|
| H05K 1/02 | (2006.01) | |
| H05K 1/16 | (2006.01) | |
| H05K 1/18 | (2006.01) | |
| H05K 1/11 | (2006.01) | |
| H05K 3/30 | (2006.01) | |
| H05K 3/34 | (2006.01) | |

(52) U.S. Cl.
CPC ............ *H05K 1/181* (2013.01); *H05K 1/111* (2013.01); *H05K 3/305* (2013.01); *H05K 3/341* (2013.01); *H05K 3/3484* (2013.01); *H05K 2201/2081* (2013.01)

(58) Field of Classification Search
CPC ........ H05K 1/181; H05K 1/111; H05K 3/305; H05K 3/341; H05K 3/3484; H05K 2201/2081

USPC .................................................. 174/259, 260
See application file for complete search history.

(56) References Cited

U.S. PATENT DOCUMENTS

| | | | | |
|---|---|---|---|---|
| 6,986,454 B2* | 1/2006 | Stillabower | .......... | H05K 3/3442 228/180.22 |
| 2007/0243664 A1* | 10/2007 | Hirano | ............... | B23K 35/0244 438/108 |
| 2008/0042300 A1* | 2/2008 | Nishimura | ............ | H01L 21/563 257/778 |
| 2008/0308930 A1* | 12/2008 | Yoshida | ................ | H01L 21/563 257/737 |

(Continued)

FOREIGN PATENT DOCUMENTS

JP 8-139233 A 5/1996

*Primary Examiner* — Sherman Ng
(74) *Attorney, Agent, or Firm* — Fitzpatrick, Cella, Harper & Scinto

(57) ABSTRACT

Provided is a printed circuit board including: an electronic component having a bottom face and a side face, in which first lands are provided on the bottom face; a printed wiring board having a mounting face, in which second lands corresponding to the first lands are provided on the mounting face, and in which the electronic component is mounted such that the bottom face faces the mounting face; a solder aggregation member provided outside the second lands on the mounting face; pieces of first solder each of which joins each of the first lands to corresponding one of the second lands; second solder formed on the solder aggregation member; and a thermosetting resin adhered to the bottom face of the electronic component outside the first lands and to the mounting face of the printed wiring board outside the second lands.

24 Claims, 8 Drawing Sheets

(56) References Cited

U.S. PATENT DOCUMENTS

2010/0116534 A1\* 5/2010 Choi .................... H01L 21/563
174/260

\* cited by examiner

PRINTED CIRCUIT BOARD, ELECTRONIC DEVICE, AND MANUFACTURING METHOD OF PRINTED CIRCUIT BOARD

BACKGROUND OF THE INVENTION

Field of the Invention

The present invention relates to a printed circuit board, an electronic device, and a manufacturing method of the printed circuit board.

Description of the Related Art

In recent years, reduction in size and improvement of performance of electronic devices have involved a reduction in size and an improvement of performance of electronic components mounted on a printed wiring board used in the electronic devices.

Packages such as a ball grid array (BGA), a land grid array (LGA), and the like that allows for a reduction in size and an increase in the number of terminals are widely used in electronic components used in an electronic device such as a mobile device, a digital camera, or the like.

Since the BGA and the LGA have the structure in which electrodes are provided on the bottom face of the package, no lead terminal is needed allowing for a reduction in size. Further, with a smaller pitch of the electrodes on the bottom face of the package, the number of signal terminals, power source terminals, or the like can be increased without an increase in the size of the package. It is therefore possible to meet the demand for improvement of performance.

On the other hand, in order to increase the number of terminals of the electrodes of a package such as a BGA, an LGA, or the like, it is necessary to make much smaller solder junctions between the package and a printed wiring board. In this case, there may be an issue of ensuring the strength of the solder junction. Specifically, a disconnection may occur in a solder junction due to an impact when the electronic device falls. Further, since improvement of performance of an electronic component involves an increased heat value during operation resulting in larger deformation due to a thermal expansion, the thermal deformation may cause a disconnection to occur in the solder junction. As discussed above, reduction in size and improvement of performance of an electronic component causes an issue of ensuring a junction reliability of a solder junction between a package and a printed wiring board.

To address this issue, Japanese Patent Application Laid-open No. H8-139233 discloses a module component that has connection lands for terminals and reinforcement lands each having an area that is three times or more the area of the connection land. An increased junction area of the reinforcement land can reduce a stress applied to solder and improve the junction reliability. As an example of the arrangement of the reinforcement lands, disclosed are an arrangement in which reinforcement lands are provided at four corners outside the area of the connection lands arranged in a grid, an arrangement in which reinforcement lands are arranged at four corners inside the area of the connection lands arranged in a grid, and the like.

In the arrangement in which the reinforcement lands are provided at four corners outside the area of the connection lands, however, the size of the package may increase. Further, in the arrangement in which the reinforcement lands are provided at four corners inside the area of the connection lands, because of decrease in the number of signal terminals, a desired performance may not be obtained. As discussed above, in the scheme of using the reinforcement lands of Japanese Patent Application Laid-open No. H8-139233, it may be difficult to achieve both reduction in size and improvement of performance of an electronic component.

SUMMARY OF THE INVENTION

The present invention intends to provide a printed circuit board with an improved junction reliability, a manufacturing method thereof, and an electronic device including the printed circuit board while achieving both reduction in size and improvement of performance of an electronic component.

A printed circuit board according to one embodiment of the present invention is a printed circuit board including: an electronic component having a bottom face and a side face, in which a plurality of first lands are provided on the bottom face; a printed wiring board having a mounting face, in which a plurality of second lands corresponding to the plurality of first lands are provided on the mounting face, and in which the electronic component is mounted such that the bottom face faces the mounting face; a solder aggregation member provided outside the plurality of second lands on the mounting face; a plurality of pieces of first solder each of which joins each of the plurality of first lands to corresponding one of the plurality of second lands; second solder formed on the solder aggregation member; and a thermosetting resin adhered to the bottom face of the electronic component outside the plurality of first lands and to the mounting face of the printed wiring board outside the plurality of second lands.

An electronic device according to one embodiment of the present invention is an electronic device including a printed circuit board, the printed circuit board including: an electronic component having a bottom face and a side face, in which a plurality of first lands are provided on the bottom face; a printed wiring board having a mounting face, in which a plurality of second lands corresponding to the plurality of first lands are provided on the mounting face, and in which the electronic component is mounted such that the bottom face faces the mounting face; a solder aggregation member provided outside the plurality of second lands on the mounting face; a plurality of pieces of first solder each of which joins each of the plurality of first lands to corresponding one of the plurality of second lands; second solder formed on the solder aggregation member; and a thermosetting resin adhered to the bottom face of the electronic component outside the plurality of first lands and to the mounting face of the printed wiring board outside the plurality of second lands.

A manufacturing method of a printed circuit board according to one embodiment of the present invention is a manufacturing method of a printed circuit board, in which the printed circuit board includes an electronic component having a bottom face and a side face, in which a plurality of first lands are provided on the bottom face; a printed wiring board having a mounting face, in which a plurality of second lands corresponding to the plurality of first lands are provided on the mounting face, and in which the electronic component is mounted such that the bottom face faces the mounting face; and a solder aggregation member provided outside the plurality of second lands on the mounting face, the manufacturing method including: a supplying step of supplying a solder paste containing a solder powder and a thermosetting resin onto the plurality of second lands and the solder aggregation member; a mounting step of mounting the electronic component on the printed wiring board; and a heating step of heating the solder paste to a temperature higher than a melting point of the solder powder to form a plurality of pieces of first solder each of which joins each of the plurality of first lands to corresponding one of the plurality of second lands and form second solder on the solder aggregation member and to adhere the thermosetting resin to the bottom face of the electronic component outside the plurality of first lands and to the mounting face of the printed wiring board outside the plurality of second lands.

Further features of the present invention will become apparent from the following description of exemplary embodiments with reference to the attached drawings.

DESCRIPTION OF THE EMBODIMENTS

Figure 1:
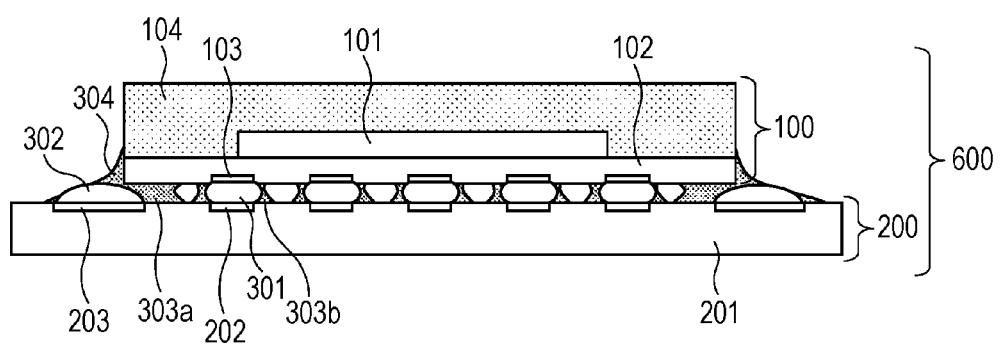
FIG. 1 is a sectional view of a printed circuit board according to a first embodiment of the present invention.

Preferred embodiments of the present invention will now be described in detail in accordance with the accompanying drawings. Elements common to multiple drawings are labeled with the same reference numeral, and the description thereof may be omitted or simplified.

First Embodiment

FIG. 1 is a sectional view of a printed circuit board 600 according to the first embodiment of the present invention. The printed circuit board 600 has a semiconductor device 100 and a printed wiring board 200 on which the semiconductor device 100 is mounted.

The semiconductor device 100 has a semiconductor element 101, a package substrate 102, and a mold resin 104. A plurality of lands 103 (first land) are provided on the bottom face of the semiconductor device 100, that is, the surface of the package substrate 102. The semiconductor device 100 is an electronic component having terminals of an LGA. The package substrate 102 is a substrate having an insulator formed of aluminum ceramics or the like and a conductive layer and has a function of electrically connecting the terminals of the semiconductor element 101 to the corresponding lands 103. The mold resin 104 is a resin formed so as to cover the semiconductor element 101 by using a fabrication method such as injection molding or the like and has a function of protecting the semiconductor element 101.

The printed wiring board 200 has a substrate 201. A plurality of lands 202 (second land) are provided on the surface of the substrate 201, and the surface of the substrate 201 functions as a mounting face on which the semiconductor device 100 is mounted. Further, solder aggregation members 203 are provided outside the plurality of lands 202 on the surface of the substrate 201. The semiconductor device 100 is mounted on the printed wiring board 200 such that the bottom face of the semiconductor device 100 faces the mounting face of the printed wiring board 200.

The lands 103 and the corresponding lands 202 are joined to each other by pieces of solder 301 (first solder). Solder 302 (second solder) is formed on each of the solder aggregation members 203. The solder aggregation member 203 may be a land (third land) formed on the surface of the substrate 201. In this case, since the lands 202 and the solder aggregation members 203 can be formed in a single process at the manufacturing of the printed wiring board 200, this allows for easier formation of the solder aggregation members 203. Further, the solder aggregation member 203 may be a metal formed in a plate shape and adhered on the surface of the substrate 201 in which solder such as copper, nickel, a 42-alloy, or the like can be wet on the metal. A solder resist having openings above the lands 202 and the solder aggregation members 203 may be further formed on the surface of the substrate 201.

The bottom face near the outer circumference of the semiconductor device 100 and the mounting face near the outer circumference of the printed wiring board 200 are adhered by using a thermosetting resin 303a. The position on the bottom face of the semiconductor device 100 where the thermosetting resin 303a is adhered is outside the lands 103. Further, the position on the mounting face of the printed wiring board 200 where the thermosetting resin 303a is adhered is outside the lands 202. The thermosetting resin 303a is adhered also on the upper face of the solder 302 and the side face of the semiconductor device 100, and a fillet 304 is formed between the solder 302 and the side face of the semiconductor device 100. Each thermosetting resin 303b is formed around the solder 301 so as to surround the solder 301.

When the thermosetting resin 303b is an insulator, a plurality of neighboring thermosetting resins 303b may be integrated. Further, both of the thermosetting resin 303a and the thermosetting resin 303b are insulators, the thermosetting resin 303a and the thermosetting resin 303b may be integrated.

In a top view from a direction perpendicular to the mounting face of the printed wiring board 200, the semiconductor device 100 is shaped in a square or a rectangle. Further, in a top view, the thermosetting resins 303a are formed near four corners of the semiconductor device 100 and formed to adhere on the bottom face and the side face of the four corners of the semiconductor device 100.

Figure 2A:
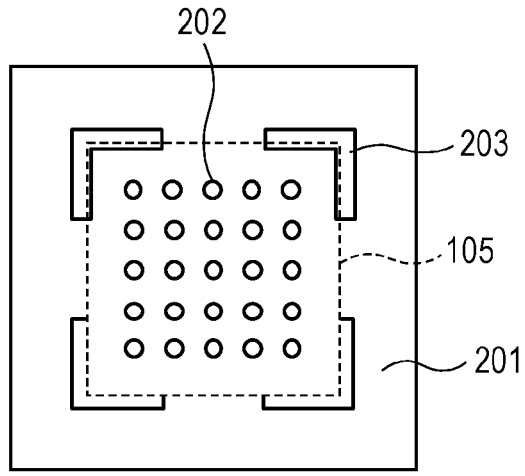
FIG. 2A, FIG. 2B, and FIG. 2C are plan views of printed wiring boards according to the first embodiment of the present invention.
Figure 2B:
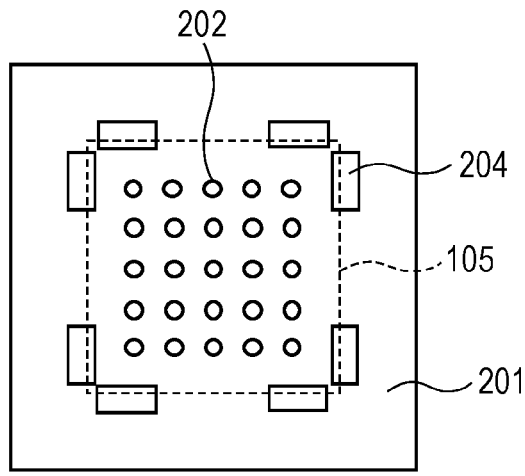
Figure 2C:
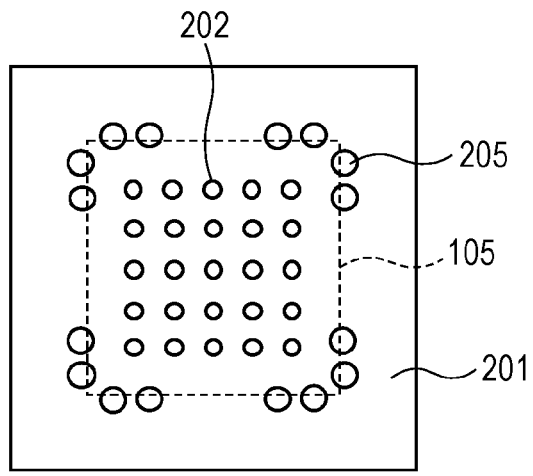

FIG. 2A, FIG. 2B, and FIG. 2C are examples of plan views of the printed wiring board 200. In FIG. 2A, the semiconductor device 100 is mounted on a mounting region 105 illustrated with a dashed line within the substrate 201. The plurality of lands 202 are provided in a grid inside the mounting region 105.

Each of the solder aggregation members 203 has an L-shape and provided near four corners of the mounting region 105. Further, each of the solder aggregation members 203 is provided at a position extending over the inside and the outside of the mounting region 105.

The shape of the solder aggregation member 203 may be other shape than the L-shape. FIG. 2B and FIG. 2C illustrate modified examples of the shape of the solder aggregation members. In FIG. 2B, each solder aggregation member 204 corresponding to the solder aggregation member 203 of FIG. 2A is shaped in a rectangle. In FIG. 2C, each solder aggregation member 205 corresponding to the solder aggregation member 203 of FIG. 2A is shaped in a circle. The shape of the solder aggregation member 203 may be other shape than the above and may be a square or an ellipse, for example.

While the solder aggregation members 203 are provided near four corners of the mounting region 105 in FIG. 2A, FIG. 2B, and FIG. 2C, another solder aggregation member 203 may be added to other positions than the above. For example, the solder aggregation member 203 may be further provided near the middle of each of four sides of the mounting region 105.

As discussed above, in the present embodiment, the thermosetting resin 303a is adhered on the bottom face near the outer circumference of the semiconductor device 100 and the mounting face of the printed wiring board 200. Thus, force applied to the solder 301 due to a stress caused by a thermal expansion, due to a drop impact, or the like is reduced, which improves the junction reliability. Further, in the present embodiment, no reinforcement land having a larger area as disclosed in Japanese Patent Application Laid-open No. H8-139233 is required to be provided to the semiconductor device 100, and therefore reduction in size and improvement of performance of the semiconductor device 100 can be achieved along with improvement of the junction reliability.

Note that the position of the solder aggregation member 203 may be set such that the vertex of the solder 302 formed on the solder aggregation member 203 is located outside the mounting region 105 of the semiconductor device 100, that is, located outside the side face of the semiconductor device 100, as illustrated in FIG. 1. Thereby, the thermosetting resin 303a is raised, and the fillet 304 of the thermosetting resin 303a is adhered up to a higher position of the side face of the semiconductor device 100.

Thus, a stress applied to the solder 301 is further reduced and the junction reliability further improves. Furthermore, the thermosetting resin 303a is raised and thus the amount of the thermosetting resin used in the manufacturing process can be reduced compared to the case without the solder aggregation member 203, and therefore the cost of material can be reduced.

A non-connection (NC) terminal may be provided near the outer circumference of the semiconductor device in order to ensure the junction reliability. Since the NC terminal is a terminal that has no function as a signal terminal, providing many NC terminals may become an obstacle in improving the performance of the printed circuit board. In contrast, because of the improvement of the junction reliability of the solder 301 in the present embodiment, the number of NC terminals can be reduced or no NC terminal may be provided. This can improve the performance of the printed circuit board 600.

Further, the solder aggregation member 203 may be electrically connected to the ground wiring of the printed wiring board 200. When the solder aggregation member 203 is in a floating state, the solder aggregation member 203 may function as an antenna and may be a source of radiation noise. To address this, with the electrical connection of the solder aggregation member 203 to the ground wiring of the printed wiring board 200, the above-described problem is avoided, which can reduce a radiation noise from the printed circuit board 600 that may occur in the case where the solder aggregation member 203 is provided.

Figure 3A:
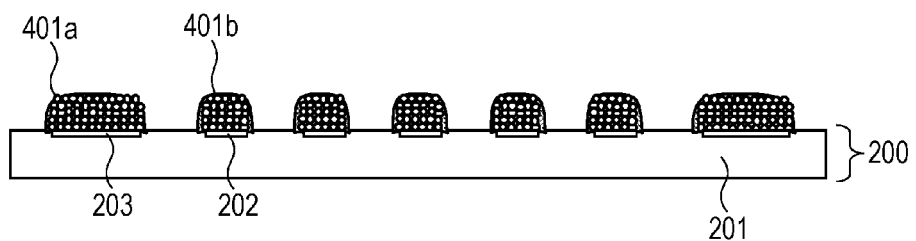
FIG. 3A, FIG. 3B, FIG. 3C, and FIG. 3D are sectional views illustrating the manufacturing process of the printed circuit board according to the first embodiment of the present invention.

Next, the manufacturing process of the above-described printed circuit board 600 will be described. FIG. 3A to FIG. 3D are sectional views illustrating the manufacturing process of the printed circuit board according to the first embodiment. FIG. 3A is a view illustrating a supplying step of supplying thermosetting resin-containing solder pastes 401a and 401b onto the solder aggregation members 203 and the lands 202, respectively.

The thermosetting resin-containing solder paste used in this step will be described. The thermosetting resin-containing solder paste is a solder paste containing at least a solder powder and a thermosetting resin. Further, the thermosetting resin-containing solder paste may further contain a flux component having a function of improving solderability by removal of an oxide film or the like. The thermosetting resin-containing solder paste can be supplied, reflowed, or the like by using a fabrication method similar to that for a normal solder paste that contains no thermosetting resin. However, the thermosetting resin-containing solder paste is different from the normal solder paste in that, when a solder powder melts during reflow heating, the thermosetting resin is separated from the melted solder. Due to the adhesion of thermosetting resin to the surrounding member after the separation of the thermosetting resin from the solder, the junction between the semiconductor device 100 and the printed wiring board 200 is reinforced and thus the junction reliability improves.

Note that, instead of the thermosetting resin-containing land paste 401b, a normal solder paste may be supplied onto the lands 202. In terms of reduction in cost and process operation time, however, it is preferable to supply all at once the thermosetting resin-containing solder paste onto the lands 202 at the same time as onto the solder aggregation members 203. Note that, for example, screen printing may be used as a fabrication method of supplying all at once the thermosetting resin-containing solder paste onto the lands 202 and onto the solder aggregation members 203.

Figure 3B:
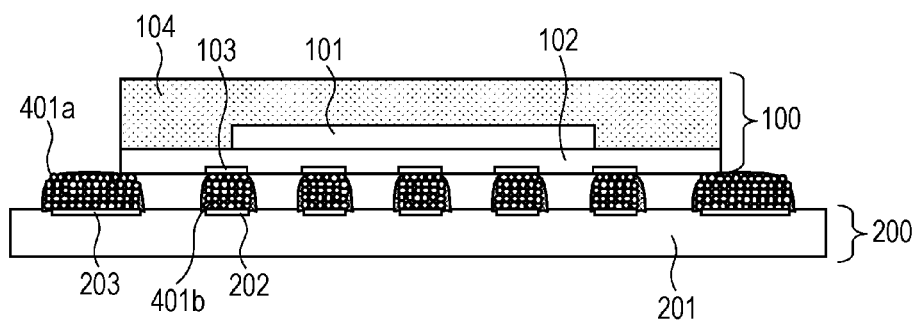

FIG. 3B is a view illustrating a mounting step of mounting the semiconductor device 100 on the printed wiring board 200 by using a mounter. As illustrated in FIG. 3B, the thermosetting resin-containing solder paste 401a is supplied so as to be higher than or equal to the height at which the thermosetting resin-containing solder paste 401a comes into contact with the bottom face of the semiconductor device 100. Further, the center of the solder aggregation member 203 is located outside the mounting region 105 of the semiconductor device 100, that is, outside the side face of the semiconductor device 100. Furthermore, the thermosetting resin-containing solder paste 401a is supplied such that the center thereof is located outside the mounting region 105 of the semiconductor device 100, that is, outside the side face of the semiconductor device 100.

Figure 3C:
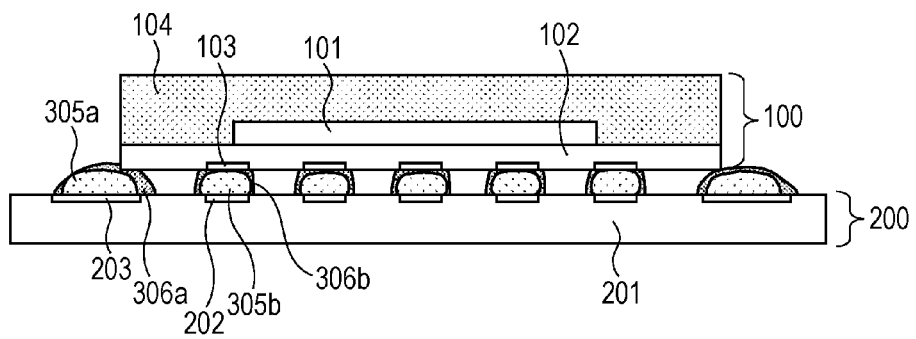

FIG. 3C is a diagram illustrating a heating step of heating the semiconductor device 100 and the printed wiring board 200 at a temperature higher than the melting point of the solder powder. This heating step causes the lands 103 and the lands 202 to be joined by solder. This heating may be performed by a reflow oven that has a good productivity, for example. Note that, since this heating step serves not only for melting of the solder powder but also for curing of the thermosetting resin, the heating temperature is set to a temperature higher than the curing start temperature of the thermosetting resin.

When the thermosetting resin-containing solder pastes 401a and 410b are heated at a temperature higher than the melting point of the solder powder, the solder powder is melted and integrated. Thus, the thermosetting resin-containing solder paste 401a is separated into melted solder 305a and a not-cured thermosetting resin 306a. In a similar manner, the thermosetting resin-containing solder paste 401b is separated into melted solder 305b and a not-cured thermosetting resin 306b.

Then, when further heated, the melted solder 305a becomes wet on the solder aggregation member 203, and the not-cured thermosetting resin 306a is aggregated on the solder aggregation member 203. Therefore, the solder aggregation member 203 is formed of a metal having a wettability to the melted solder 305a. For example, one or more metals selected from a group consisting of copper (Cu), nickel (Ni), gold (Au), tin (Sn), bismuth (Bi), iron (Fe), and zinc (Zn) may be used for a metal on which solder becomes wet. Further, the solder aggregation member 203 may be formed of an alloy of the above metals, or may be a laminated film containing the above metals.

Since the center of the solder aggregation member 203 is located outside the mounting region 105 of the semiconductor device 100, the melted solder 305a inside the mounting region 105 flows outward the semiconductor device 100. Thus, the melted solder 305a is less likely to flow in the direction toward the land 202, that is, in the direction toward the melted solder 305b, which can reduce occurrence of a solder bridge (a short-circuit between the neighboring pieces of solder).

On the other hand, the not-cured thermosetting resin 306a infiltrates between the bottom face of the semiconductor device 100 and the mounting face of the printed wiring board 200 by a capillarity. As illustrated in FIG. 2A, FIG. 2B, and FIG. 2C, since the solder aggregation members 203 are provided at the four corners of the semiconductor device 100, curing of the thermosetting resin 306a causes adhesion around the four corners of the semiconductor device 100.

Further, when the center of the solder aggregation member 203 as illustrated in FIG. 3C is set to be located outside the mounting region 105 of the semiconductor device 100, the vertex of the melted solder 305a is located outside the side face of the semiconductor device 100 in a top view. A part of the not-cured thermosetting resin 306a is raised by the melted solder 305a and attached up to a higher position of the side face of the semiconductor device 100. Thereby, the fillet 304 is formed after curing.

On the other hand, melting and solidification of the thermosetting resin-containing solder paste 401b causes the lands 103 and the lands 202 to be joined by solder. At this time, the not-cured thermosetting resin 306b separated from the thermosetting resin-containing solder paste 401b and the not-cured thermosetting resin 306a separated from the thermosetting resin-containing solder paste 401a on the solder aggregation member 203 may be integrated. In this case, when the cured thermosetting resin 303a and the cured thermosetting resin 303b are insulators, a short-circuit between terminals due to such an integration can be avoided. Further, the not-cured thermosetting resins 306b may be integrated on a plurality of neighboring lands. In this case, when the cured thermosetting resin 303b is an insulator, a short-circuit between terminals due to such an integration can be avoided.

As described above, it is desirable to provide the solder aggregation members 203 near the four corners of the semiconductor device 100. However, the positions of the solder aggregation members 203 may be away from the four corners of the semiconductor device 100 as long as the thermosetting resins 303a are adhered on the bottom face at the four corners of the semiconductor device 100 after reflow.

Figure 3D:
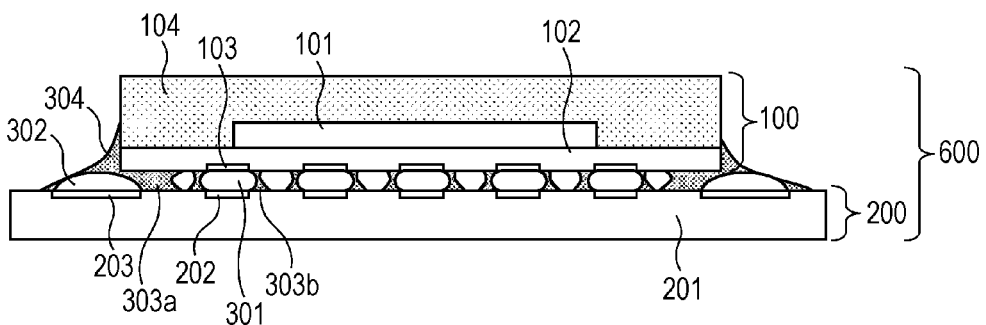

FIG. 3D is a view illustrating a state after heating is continued for a predetermined time at a temperature exceeding the curing temperature of the thermosetting resin and then cooling to a temperature lower than the melting point of the solder is performed. Thereby, the printed circuit board 600 illustrated in FIG. 1 is completed.

According to the manufacturing method described above, the bottom face near the outer circumference of the semiconductor device 100 and the mounting face of the printed wiring board 200 can be adhered by the thermosetting resin 303a. This improves the junction reliability of the solder 301 that connects the semiconductor device 100 to the printed wiring board 200. Further, since this manufacturing method does not require a step of supplying an under-fill, the cost in manufacturing the printed circuit board 600 is reduced.

Further, the configuration in which the reinforcement lands each having a large area are provided to a package as disclosed in Japanese Patent Application Laid-open No. H8-139233 requires a large amount of a solder paste to be supplied to the reinforcement lands. In this case, solder on the reinforcement land is collapsed when the solder paste is melted, which may cause a solder bridge between the reinforcement land and another land. In contrast, since it is not necessary to use the above-described reinforcement land in the present embodiment, such a solder bridge due to the reinforcement land can be suppressed.

Second Embodiment

Figure 4:
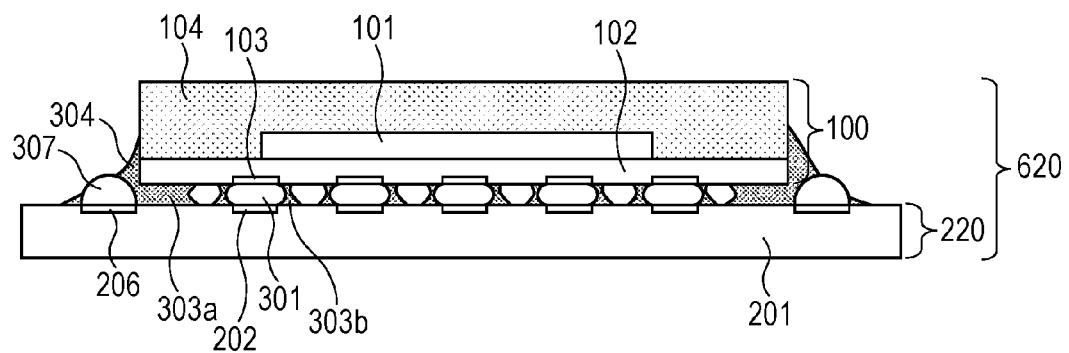
FIG. 4 is a sectional view of a printed circuit board according to a second embodiment of the present invention.

FIG. 4 is a sectional view of a printed circuit board 620 according to the second embodiment of the present invention. FIG. 4 is different from FIG. 1 of the first embodiment in that the entire solder aggregation member 206 is provided outside the mounting region 105 of the semiconductor device 100, that is, outside the side face of the semiconductor device 100. Thus, solder 307 formed on the solder aggregation member 206 is also entirely located outside the mounting region 105 of the semiconductor device 100.

Figure 5A:
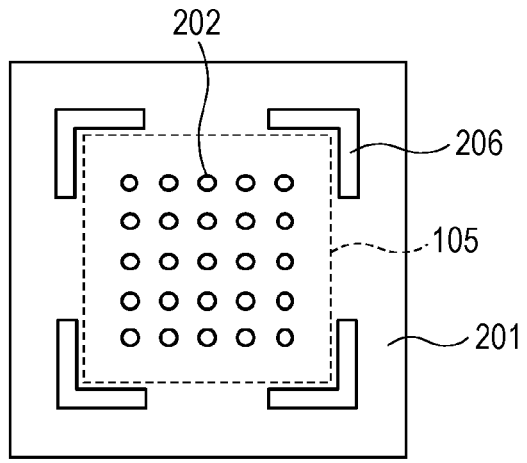
FIG. 5A, FIG. 5B, and FIG. 5C are plan views of printed wiring boards according to the second embodiment of the present invention.
Figure 5B:
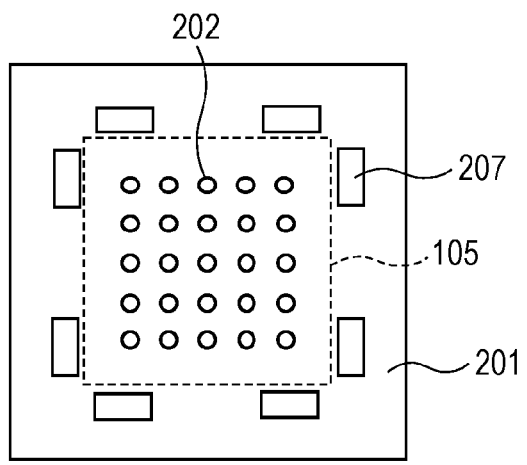
Figure 5C:
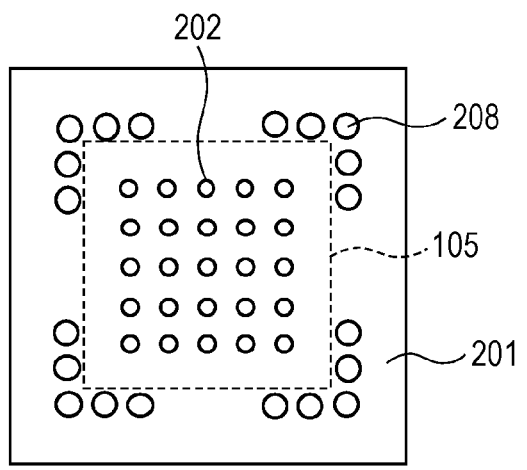

FIG. 5A, FIG. 5B, and FIG. 5C are examples of plan views of the printed wiring board 220. FIG. 5A, FIG. 5B, and FIG. 5C are drawings corresponding to FIG. 2A, FIG. 2B, and FIG. 2C of the first embodiment. While the solder aggregation member 203 is provided in a position extending over the inside and the outside of the mounting region 105 in FIG. 2A of the first embodiment, the entire solder aggregation member 206 is provided outside the mounting region 105 in FIG. 5A of the present embodiment. The same applies to a solder aggregation member 207 of FIG. 5B and a solder aggregation member 208 of FIG. 5C.

FIG. 6A to FIG. 6D are sectional views illustrating the manufacturing process of the printed circuit board 620 of the second embodiment. FIG. 6A to FIG. 6D are the same as FIG. 3A to FIG. 3D of the first embodiment except that the solder aggregation member 206 and the solder 307 are outside the mounting region 105 of the semiconductor device 100 in the top view, and thus the detailed description thereof will be omitted.

Also in the present embodiment, the same advantages as those in the first embodiment can be obtained. In the present embodiment, even when the solder aggregation member 203 cannot be arranged inside the mounting region 105 due to the structure of the first embodiment, that is, even when the distance between the outermost solder 301 and the edge of the semiconductor device 100 is short, the solder aggregation member 203 can be arranged.

Third Embodiment

FIG. 7A to FIG. 7D are sectional views illustrating the manufacturing process of the printed circuit board 640 according to the third embodiment. FIG. 7A to FIG. 7D are different from FIG. 6A to FIG. 6D of the second embodiment in that a semiconductor device 120 is an electronic component having terminals of a BGA. The semiconductor device 120 has solder balls 106 each formed on corresponding one of the plurality of lands 103. Since other features are the same as those in the second embodiment, the description thereof will be omitted.

According to the present embodiment, the same advantages as those in the first embodiment and the second embodiment can be obtained also in the electronic component having terminals of a BGA.

Note that, when supplying the thermosetting resin-containing solder paste 401a, it is desirable that the height of the supplied thermosetting resin-containing solder paste 401a be higher than the solder balls 106. The reasons thereof are as follows. A sufficient amount of the thermosetting resin 303a separated from the thermosetting resin-containing solder paste 401a is ensured, which can further improve the junction reliability. Further, with the height of the thermosetting resin-containing solder paste 401a being set higher than the solder balls 106, the thermosetting resin-containing solder paste 401a is in contact with the semiconductor device 120. Thus, when the thermosetting resin-containing solder paste 401a is melted, the separated not-cured thermosetting resin 306a becomes wet and rises up on the side face of the semiconductor device 120, and the fillet 304 can be formed.

It is expected that the height of the thermosetting resin-containing solder paste 401a may be restricted. For example, when the height of the thermosetting resin-containing solder paste 401a which can be supplied is limited for the reason of the fabrication method, an excessively large height of the thermosetting resin-containing solder paste 401a may cause the problem such as a solder bridge after heating. In such a case, by selecting the terminal structure in which the height of the solder ball 106 is lower than the limit height of the thermosetting resin-containing solder paste 401a, the height of the thermosetting resin-containing solder paste 401a can be higher than that of the solder ball 106.

Fourth Embodiment

Figure 8:
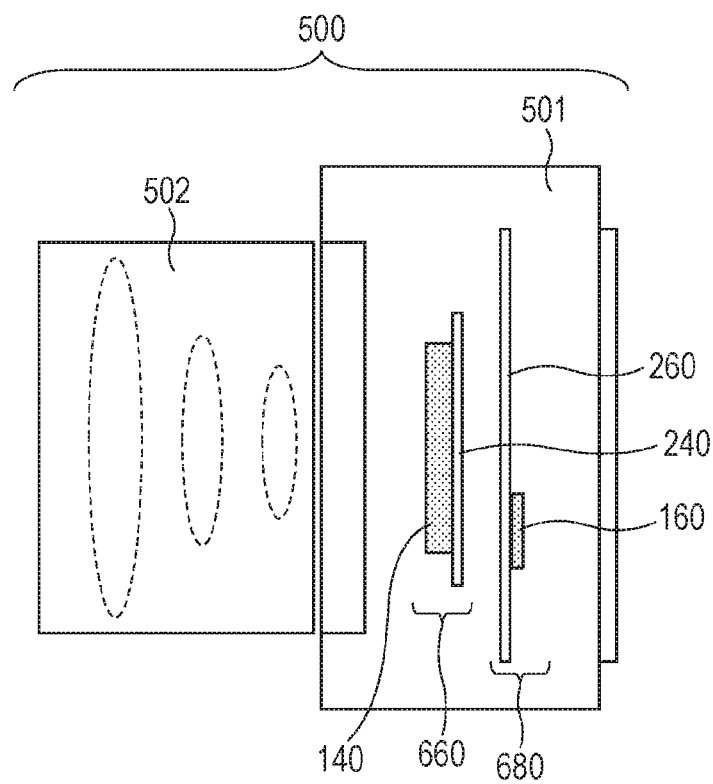
FIG. 8 is a diagram illustrating an electronic device according to a fourth embodiment of the present invention.

FIG. 8 is a diagram illustrating a schematic configuration of a digital camera 500 that is an example of an electronic device according to the fourth embodiment of the present invention. The digital camera 500 is a digital camera with interchangeable lenses, and a lens unit 502 is removable with respect to a main unit 501. The main unit 501 includes a printed circuit board according to the first to third embodiments.

The main unit 501 has printed circuit boards 660 and 680 having the structure of any of the first to third embodiments. The printed circuit board 660 has the structure in which an image pickup device 140, which is an example of the semiconductor device, is mounted on a printed wiring board 240. The image pickup device 140 is a Complementary Metal Oxide Semiconductor (CMOS) image sensor or a Charge Coupled Device (CCD) image sensor, for example. The printed circuit board 660 has a function of converting an incident light via the lens unit 502 into an electrical signal.

The printed circuit board 680 has the structure in which an image processing device 160, which is an example of the semiconductor device, is mounted on a printed wiring board 260. The image processing device 160 is a digital signal processor, for example. The printed circuit board 680 has a function of performing signal processing, such as correction, on the electrical signal obtained by the printed circuit board 660 and generating image data.

In the printed circuit boards 660 and 680 having the configuration of any of the first to third embodiments, the junction reliability is improved. Therefore, according to the present embodiment, an electronic device such as the digital camera 500 with an improved reliability can be provided.

Further, since the printed circuit boards 660 and 680 are manufactured by the manufacturing method described in the first to third embodiments, an electronic device such as the digital camera 500 with a reduced cost can be provided.

EXAMPLES

Examples will be described below in which a printed circuit board according to the second embodiment was manufactured and evaluated.

Manufacturing of Printed Circuit Board

First, the members forming the printed circuit board manufactured in the present example will be described with reference to FIG. 4, FIG. 5A, FIG. 5B, and FIG. 5C again. The semiconductor device 100 used in the present example is a device including an image sensor, and the size of the external shape of the semiconductor device 100 is around 35.0 [mm]×28.0 [mm] in a top view. Further, the external terminals of the semiconductor device 100 are of an LGA.

The primary material of the package substrate 102 used in the semiconductor device 100 is aluminum ceramics and has a thickness of 1.0 [mm]. The diameter of the land 103 formed on the bottom face of the semiconductor device 100 is 1.0 [mm]. The land 103 is arranged in a grid at a pitch of 1.6 [mm].

The base material of the substrate 201 of the printed wiring board 220 is Flame Retardant Type 4 (FR-4). The size of the external shape of the printed wiring board 220 is around 50.0 [mm]×50.0 [mm] in a top view, and the surface of the printed wiring board 220 is coated with a solder resist.

On the substrate 201, each of the lands 202 is formed in a position corresponding to each of the lands 103. Each of the solder aggregation members 206 formed on the substrate 201 is a land formed on the substrate 201 in a similar manner to the land 202, and the primary material thereof is copper.

In order to reduce a radiation noise from the solder aggregation members 206 during operation of the printed circuit board, the solder aggregation members 206 are electrically connected to an inner ground layer of the printed wiring board 220 through vias inside the printed wiring board 220. The solder aggregation members 206 are provided near four corners of the mounting region 105 and outside the mounting region 105.

In the present example, three types of printed circuit boards having different shapes of the solder aggregation members were manufactured. The shapes of the solder aggregation members 206, 207, and 208 of the three types of the printed circuit boards are an L-shape, a rectangle, and a circle as illustrated in FIG. 5A to FIG. 5C, respectively.

Each of the L-shaped solder aggregation members 206 is shaped such that rectangular lands with a width of 1.0 [mm] and a length of 6.5 [mm] are overlapped in an L-shape. Each of the rectangular solder aggregation members 207 is a rectangle with a width of 1.0 [mm] and a length of 5.5 [mm]. Two solder aggregation members 207 are provided to each corner of the mounting region 105.

The circle solder aggregation members 208 each have a diameter of 1.0 [mm] and are aligned at a pitch of 1.6 [mm]. Five solder aggregation members 208 are provided to each corner of the mounting region 105. As illustrated in FIG. 5A to FIG. 5C, the entire solder aggregation members 206, 207, and 208 are provided outside the mounting region 105. The clearance between the mounting region 105 and the solder aggregation members 206, 207, and 208 is 0.50 [mm].

Next, the thermosetting resin-containing solder paste used in the manufacturing of the printed circuit board will be described. The solder powder of the thermosetting resin-containing solder paste used in this example is Sn-58Bi solder whose melting point is 139 degrees Celsius. Further, the content percentage of the solder powder in the thermosetting resin-containing solder paste is around 40 [wt %].

The thermosetting resin contained in the thermosetting resin-containing solder paste is an epoxy resin whose curing start temperature is around 120 degrees Celsius. The cured thermosetting resin is an insulator. The thermosetting resin-containing solder paste further contains a flux component for ensuring solderability.

Next, the manufacturing process of the printed circuit board will be specifically described with reference to FIG. 6A to FIG. 6D again. First, the thermosetting resin-containing solder pastes 401a and 401b were supplied onto the solder aggregation members 206 and the lands 202 by screen printing using a print plate with a thickness of 0.20 [mm].

Figure 6A:
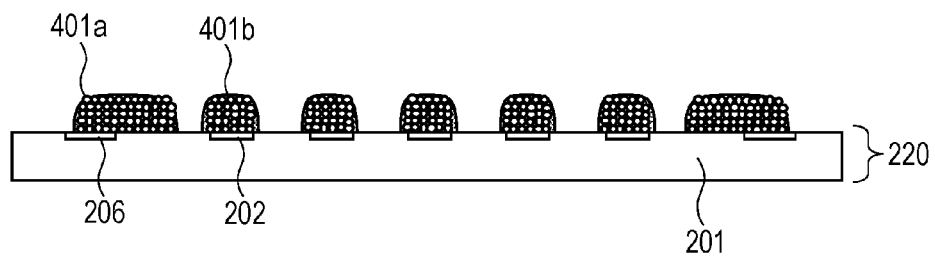
FIG. 6A, FIG. 6B, FIG. 6C, and FIG. 6D are sectional views illustrating the manufacturing process of the printed circuit board according to the second embodiment of the present invention.
Figure 6B:
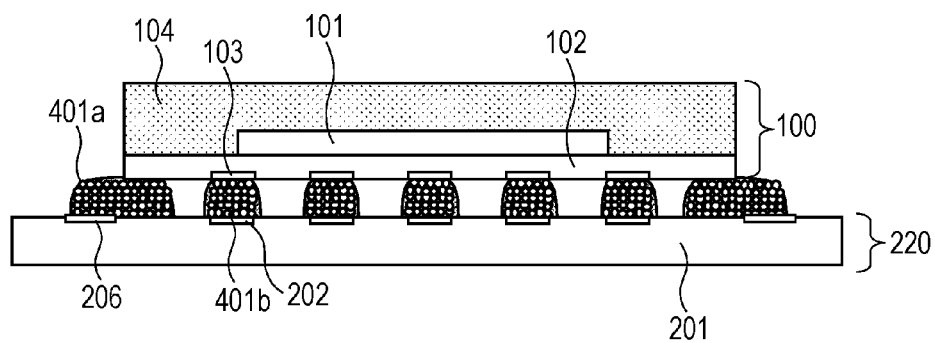
Figure 6C:
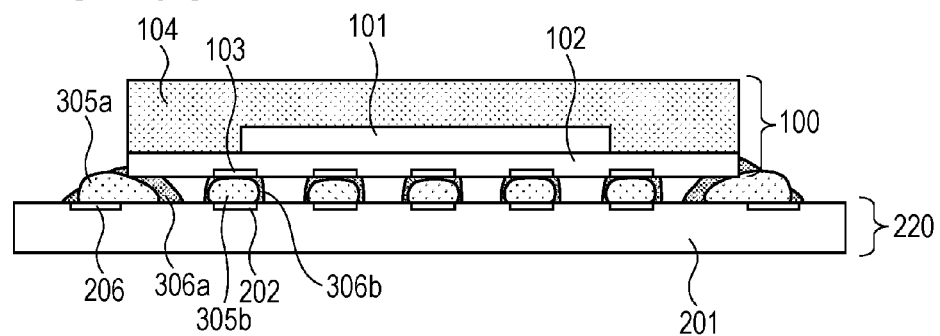
Figure 6D:
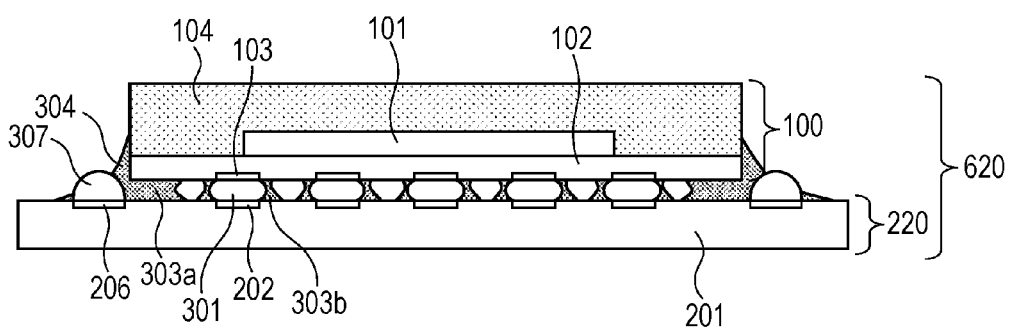
Figure 7A:
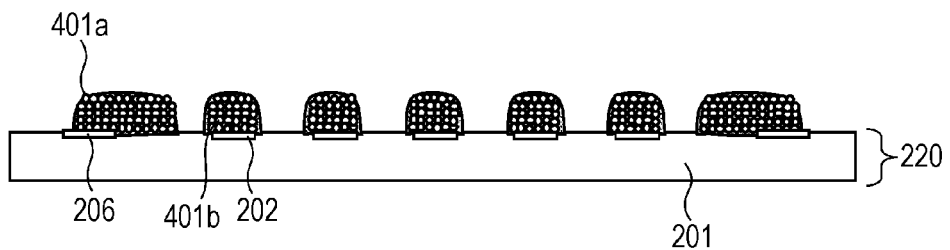
FIG. 7A, FIG. 7B, FIG. 7C, and FIG. 7D are sectional views illustrating the manufacturing process of the printed circuit board according to a third embodiment of the present invention.
Figure 7B:
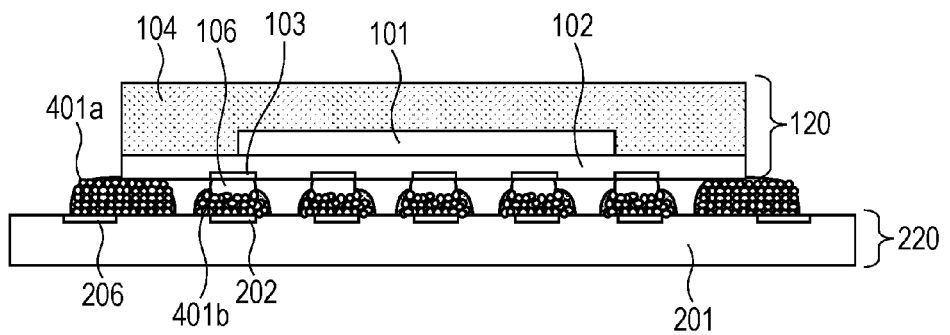
Figure 7C:
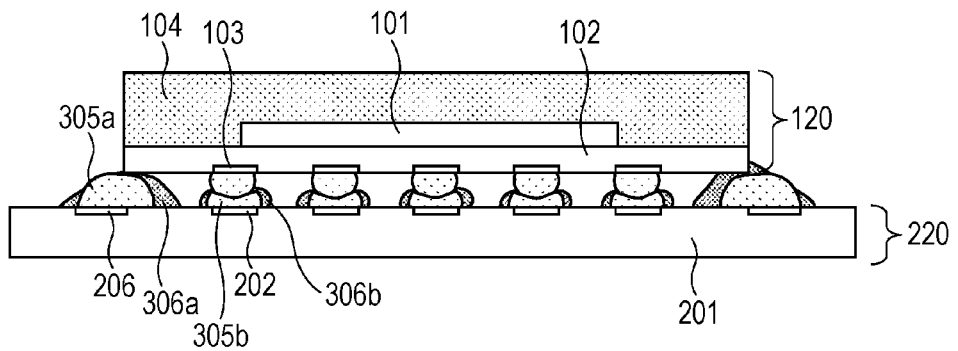
Figure 7D:
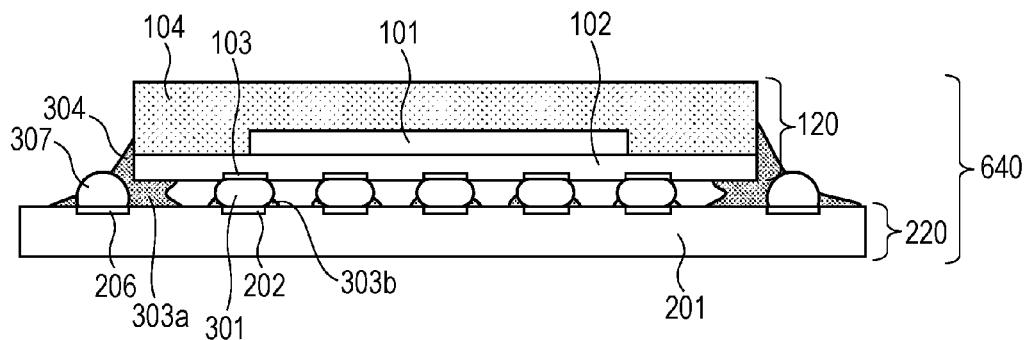

At this time, the thermosetting resin-containing solder paste 401a was supplied to overlap not only with the solder aggregation members 206 but also with the mounting region 105 of the semiconductor device 100 by 0.3 [mm] as illustrated in FIG. 6A and FIG. 6B.

Note that the distance between the thermosetting resin-containing solder paste 401a and the thermosetting resin-containing solder paste 401b supplied onto the land 202 closest to the solder aggregation member 206 is 0.60 [mm].

Next, the semiconductor device 100 was mounted on the printed wiring board 220 by using a mounter such that the thermosetting resin-containing solder paste 401a is in contact with the bottom face of the semiconductor device 100 as illustrated in FIG. 6B.

At this time, the mounting pressure of the mounter was adjusted to a pressure within a range where neighboring thermosetting resin-containing solder pastes 401b do not contact with each other even when the thermosetting resin-containing solder pastes 401b supplied onto the plurality of lands 202 are collapsed.

Figure 9:
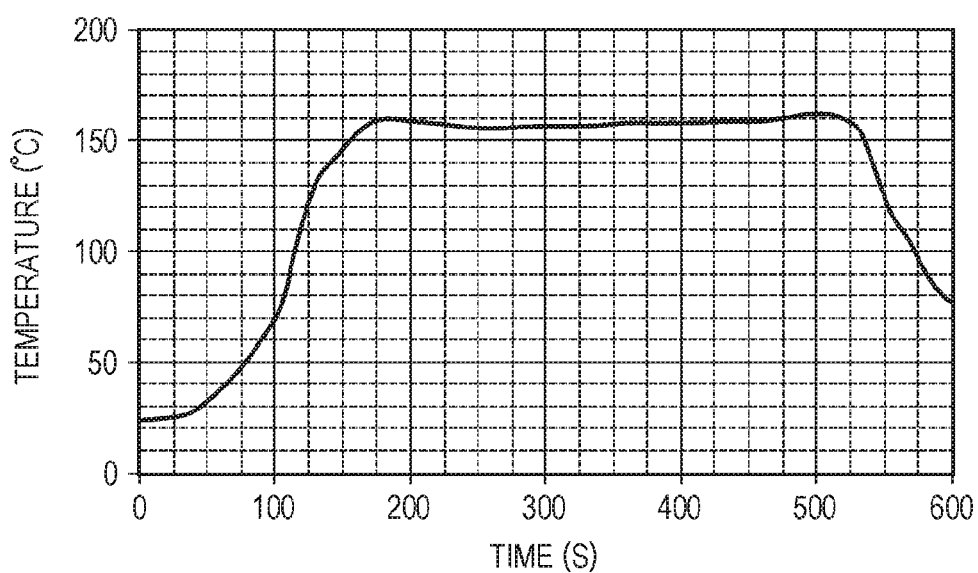
FIG. 9 is an example of a reflow profile used in the manufacturing of a printed circuit board.

Next, the thermosetting resin-containing solder pastes 401a and 401b were melted by reflow heating. The reflow profile at this time is illustrated in FIG. 9. The reflow profile of FIG. 9 is featured in the absence of a preheat step (preliminary heating step) for maintaining a temperature lower than a temperature at which the solder powder melts (melting point) and the presence of a curing step for maintaining the highest temperature of around 160 degrees Celsius for a predetermined curing time. Such the highest temperature is higher than a temperature at which the solder powder melts and higher than a curing start temperature of the thermosetting resin.

The reason for the absence of a preheat step is to prevent the thermosetting resin from curing and losing fluidity before the solder powders of the thermosetting resin-containing solder pastes 401a and 401b melt in the preheat.

Further, the reason for maintaining the temperature around the highest temperature for a predetermined time is to cure the thermosetting resin separated from the solder after the solder powder has melted and adhere the semiconductor device 100 to the printed wiring board 220.

In the heating step of the present example, the thermosetting resin was cured to adhere the semiconductor device 100 to the printed wiring board 220 by maintaining the temperature above 150 degrees Celsius for around 350 seconds as illustrated in the reflow profile of FIG. 9. Then, the printed circuit board was passed through a cooling zone of the reflow oven and cooled to a temperature below 139 degrees Celsius, which is the melting point of the solder, to solidify the solder and complete the joining.

Evaluation of Printed Circuit Board

First, the external appearance after the reflow of the printed circuit board manufactured by the above-described manufacturing method was inspected. In all the cases of the L-shape solder aggregation member, the rectangular solder aggregation member, and the circular solder aggregation member, the solder 307 was formed on the solder aggregation member, and the vertex of the solder 307 was located outside the outer circumference of the semiconductor device 100. Further, the thermosetting resin 303a separated when the formation of the solder 307 was raised by the solder 307 and thereby attached up to near the upper part of the side face of the semiconductor device 100, and the fillet 304 was formed.

Next, occurrence of a solder bridge was inspected by using a transmission-type X-ray inspection apparatus. In all the cases of the L-shape solder aggregation member, the rectangular solder aggregation member, and the circular solder aggregation member, no solder bridge between the solder 301 and the solder 307 was found. This is because the solder powder contained in the thermosetting resin-containing solder paste 401a is aggregated on the solder aggregation member 206 and therefore do not remain between the solder aggregation member 206 and the land 202. In a similar manner, no solder bridge was found among a plurality of pieces of solder 301.

Next, in order to inspect the shape of the cured thermosetting resin 303a, the semiconductor device 100 was peeled from the printed wiring board 220 and observed. In all the cases of the L-shape solder aggregation member, the rectangular solder aggregation member, and the circular solder aggregation member, the cured thermosetting resin 303a was cured near the bottom face at four corners of the semiconductor device 100 and thereby the bottom face of the semiconductor device 100 and the surface of the printed wiring board 220 were adhered.

In this peeling operation, a phenomenon that the solder resist formed on the surface of the printed wiring board 220 is peeled from the substrate 201 was observed. It is considered from this phenomenon that the adhesive strength of the cured thermosetting resin 303a is equal to or greater than the adhesive strength between the solder resist and the printed wiring board 220, and it was seen that the thermosetting resin 303a tightly adhered the semiconductor device 100 to the printed wiring board 220. Therefore, a load on the solder due to deformation caused by heat generation during operation of the semiconductor device 100 and due to an impact at falling, in particular, a load on the solder 301 near four corners of the semiconductor device 100 was reduced and thus the junction reliability was improved.

Further, while it was found that the thermosetting resin 303a was integrated with the thermosetting resin 303b around the solder 301 in the observation after the peeling, since the cured thermosetting resins are insulators, no electrical defect was found.

Other Embodiments

While the image pickup device and the image processing device have been illustrated as an example of a semiconductor device in the embodiments described above, the embodiments can be applied to other semiconductor devices such as a memory integrated circuit (IC), a power source IC, or the like. Further, a semiconductor device is an example of an electronic component, and the present invention can be applied to electronic components other than the semiconductor device as long as the electronic component has external terminals of a BGA or an LGA.

Further, while the digital camera 500 has been illustrated as an example of an electronic device in the fourth embodiment, the invention is not limited thereto and can be applied to any electronic device such as a mobile communication device or the like.

According to the embodiments described above, a printed circuit board with an improved junction reliability, a manufacturing method thereof, and an electronic device including the printed circuit board can be provided while achieving both reduction in size and improvement of performance of an electronic component.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-188369, filed Sep. 27, 2016, which is hereby incorporated by reference herein in its entirety.

What is claimed is:

1. A printed circuit board comprising:
an electronic component having a side face and a face on which a plurality of first lands are arranged;
a printed wiring board having a face on which a plurality of second lands corresponding to the plurality of the first lands are arranged;
a plurality of pieces of first solder each of which electrically connects each of the plurality of the first lands to corresponding one of the plurality of the second lands;
second solder arranged outside of an outermost one of the plurality of pieces of the first solder; and
a thermosetting resin that covers at least a part of the second solder and adheres the side face of the electric component and the printed wiring board.

2. The printed circuit board according to claim 1, wherein a vertex of the second solder is located outside the side face of the electronic component.

3. The printed circuit board according to claim 1, wherein the printed wiring board further has a third land on which the second solder is arranged, the third land being arranged so that the third land overlaps a part of a mounting region for the electronic component on the printed wiring board.

4. The printed circuit board according to claim 1, wherein the printed wiring board further has a third land on which the second solder is arranged, the third land being arranged outside a mounting region for the electronic component on the printed wiring board.

5. The printed circuit board according to claim 1, wherein the printed wiring board further has a third land connected to a ground of the printed wiring board.

6. The printed circuit board according to claim 1, wherein the printed wiring board further has a third land formed of at least one metal selected from the group consisting of copper, nickel, gold, tin, bismuth, iron, and zinc.

7. The printed circuit board according to claim 1, wherein the thermosetting resin is an insulator after it is cured.

8. An electronic device comprising a main unit and a printed circuit board arranged in the main unit, the printed circuit board comprising:
an electronic component having a side face and a face on which a plurality of first lands are arranged;
a printed wiring board having a face on which a plurality of second lands corresponding to the plurality of the first lands are arranged;
a plurality of pieces of first solder each of which electrically connects each of the plurality of the first lands to corresponding one of the plurality of the second lands;
second solder arranged outside of an outermost one of the plurality of pieces of the first solder; and
a thermosetting resin that covers at least a part of the second solder and adheres the side face of the electric component and the printed wiring board.

9. A manufacturing method of a printed circuit board, wherein the printed circuit board comprises:
an electronic component having a side face and a face on which a plurality of first lands are arranged;
a printed wiring board having a face on which a plurality of second lands corresponding to the plurality of the first lands are arranged;
a plurality of pieces of first solder each of which electrically connects each of the plurality of the first lands to corresponding one of the plurality of the second lands;
second solder arranged on a third land that is arranged outside of an outermost one of the plurality of pieces of the first solder; and
a thermosetting resin that covers at least a part of the second solder and adheres the side face of the electric component and the printed wiring board,
the manufacturing method comprising:
a supplying step of supplying a paste containing a solder powder and a thermosetting resin onto the plurality of second lands and the third land;
a mounting step of mounting the electronic component on the printed wiring board; and
a heating step of heating the paste to a temperature higher than a melting point of the solder powder.

10. The manufacturing method of the printed circuit board according to claim 9, wherein a vertex of the second solder is located outside the side face of the electronic component.

11. The manufacturing method of the printed circuit board according to claim 9, wherein the third land is arranged so that the third land overlaps a part of a mounting region for the electronic component on the printed wiring board.

12. The manufacturing method of the printed circuit board according to claim 9, wherein the third land is arranged outside a mounting region for the electronic component on the printed wiring board.

13. The manufacturing method of the printed circuit board according to claim 9, wherein the third land is formed of at least one metal selected from the group consisting of copper, nickel, gold, tin, bismuth, iron, and zinc.

14. The manufacturing method of the printed circuit board according to claim 9, wherein the third land is connected to a ground of the printed wiring board.

15. The manufacturing method of the printed circuit board according to claim 9, wherein the paste is supplied by screen printing.

16. The manufacturing method of the printed circuit board according to claim 9, wherein the heating step comprises reflow heating.

17. The manufacturing method of the printed circuit board according to claim 9, wherein the thermosetting resin is an insulator after it is cured.

18. The manufacturing method of the printed circuit board according to claim 9, wherein the heating step includes no preheat step of maintaining a temperature lower than the melting point of the solder powder and includes a curing step of maintaining a temperature which is higher than the melting point of the solder powder and higher than a curing start temperature of the thermosetting resin for a predetermined curing time.

19. The manufacturing method of the printed circuit board according to claim 9, wherein the electronic component further includes a solder ball formed on each of the plurality of the first lands before the mounting step.

20. The manufacturing method of the printed circuit board according to claim 19, wherein a height of the paste supplied in the supplying step is higher than a height of the solder ball.

21. The printed circuit board according to claim 1, wherein the thermosetting resin is arranged near four corners of the electronic component.

22. The electronic device according to claim 8, wherein the electronic component is an image pickup device.

23. The electronic device according to claim 22, further comprising a lens unit that is removable with respect to the main unit.

24. The manufacturing method of the printed circuit board according to claim 9, wherein the third land is arranged near four corners of the electronic component.

* * * * *